United States Patent [19]

Harada et al.

[11] Patent Number: 4,781,511

[45] Date of Patent: Nov. 1, 1988

[54] SEMICONDUCTOR PROCESSING SYSTEM

[75] Inventors: Hiroshi Harada; Yoshiyuki Iwasawa; Tsutomu Ishida; Shintaro Kobayashi, all of Tokyo, Japan

[73] Assignee: Shimizu Construction Co., Ltd., Tokyo, Japan

[21] Appl. No.: 932,182

[22] Filed: Nov. 18, 1986

[30] Foreign Application Priority Data

Mar. 25, 1986 [JP] Japan .................................. 61-66761

[51] Int. Cl.$^4$ ............................................ C23C 15/00
[52] U.S. Cl. ..................... 414/217; 118/50;
118/729; 118/730; 118/500; 414/225; 414/416; 414/331; 414/752
[58] Field of Search ............... 414/222, 217, 225, 226, 414/416, 331, 752; 118/500, 729, 730, 733, 50, 50.1

[56] References Cited

U.S. PATENT DOCUMENTS

| | | | |
|---|---|---|---|
| 4,355,937 | 10/1982 | Mack et al. ............ | 414/217 |
| 4,405,435 | 9/1983 | Takeishi et al. ............ | 414/217 X |
| 4,412,771 | 11/1983 | Gerlach et al. ............ | 414/217 |
| 4,532,970 | 8/1985 | Tullis et al. ............ | 414/217 X |
| 4,636,128 | 1/1987 | Millis et al. ............ | 414/217 |
| 4,657,475 | 4/1987 | Ohtsuji et al. ............ | 414/754 X |
| 4,674,936 | 6/1987 | Bonora ............ | 414/217 |
| 4,674,939 | 6/1987 | Maney et al. ............ | 414/217 X |
| 4,676,709 | 6/1987 | Bonora et al. ............ | 414/217 |

FOREIGN PATENT DOCUMENTS

| | | | |
|---|---|---|---|
| 129108 | 12/1984 | European Pat. Off. ........ | 414/744 B |
| 8600870 | 2/1986 | PCT Int'l Appl. ............ | 414/217 |

OTHER PUBLICATIONS

A Technology for Wafer Cassette Transfer in VLSI Manufacturing, from Solid State Technology, Copyright 7/84 by M. Parikh & U. Kaempf.

Primary Examiner—Frank E. Werner
Attorney, Agent, or Firm—Kane, Dalsimer, Sullivan, Kurucz, Levy, Eisele and Richard

[57] ABSTRACT

A semiconductor processing system which includes: a first semiconductor wafer cassette for housing semiconductor wafers; a first transfer pod for enclosing the first cassette airtightly, the first pod having a box-like pod body with an open bottom and a bottom plate detachably attached to the pod body for closing the bottom of the pod body; a wafer processing equipment having a first port for loading the cassette and a canopy covering the first port, the processing equipment processing the wafer in the first cassette when the cassette is loaded in the first port; and a first mechanism for transferring the first cassette between the first port of the processing equipment and the first pod without exposing the cassette and the wafers therein to outside contamination. The first transferring mechanism includes: a second port, provided on the canopy of the processing equipment at the position directly above the first port, for placing the first pod on the second port, the second port including a port assembly for attaching and detaching the bottom plate of the first pod to and from the pod body when the first pod is placed on the second port; and a first lift mechanism, arranged mainly between the first and second ports, for conveying the bottom plate of the first pod between the first and second ports when the bottom plate of the pod is detached from the pod body.

8 Claims, 6 Drawing Sheets

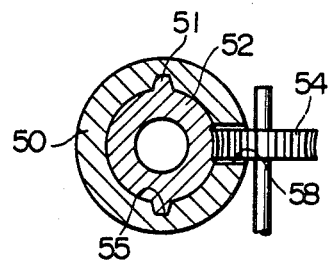
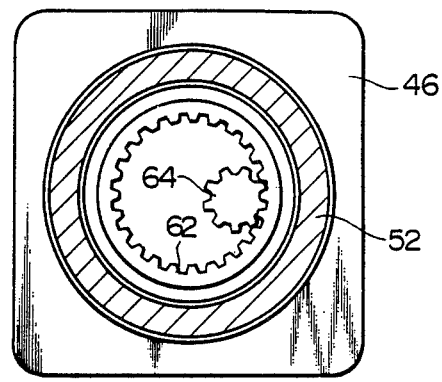
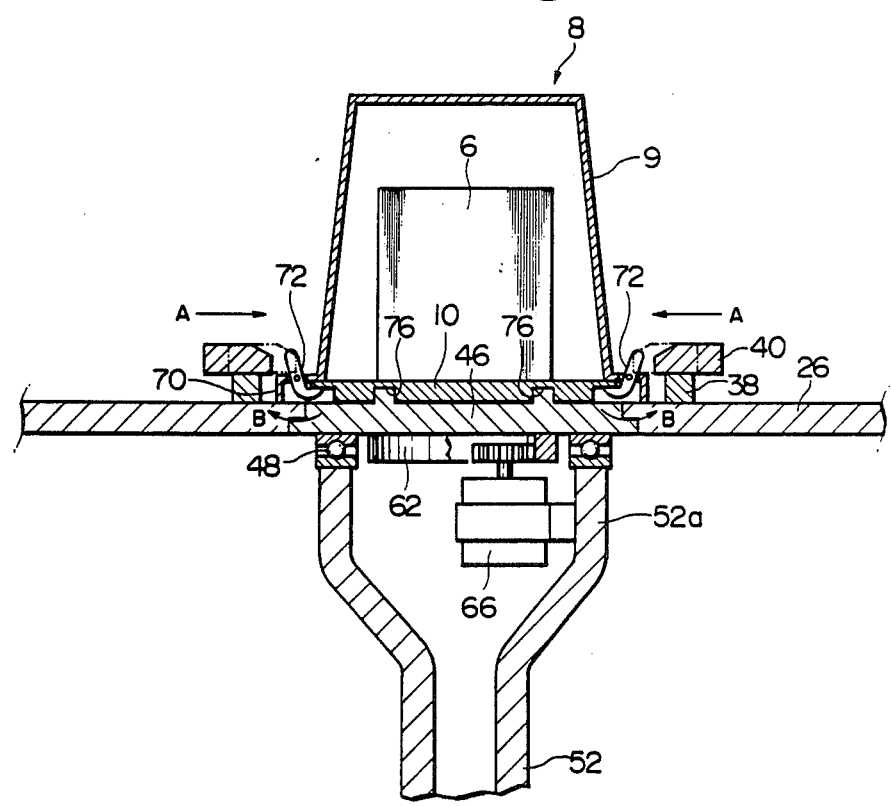

SEMICONDUCTOR PROCESSING SYSTEM

BACKGROUND OF THE INVENTION

The present invention relates to a semiconductor processing system used for producing VLSIs, ICs, and the like.

It is well known that the dust is serious bar to the fabrication processes of semiconductor devices such as ICs especially in the preprocessing step for forming circuit elements on semiconductor wafers and in the transferring step of wafers between processing equipments. Cleanliness in a working atmosphere directly determines the product yield.

A SMIF (Standard Mechanical Interface) system (Solid State Technology, July 1984: "SMIF, A Technology for Wafer Cassette Transfer in VLSI Manufacturing", page 111) is known as a conventional semiconductor processing system which satisfies such a processing condition of semiconductor devices.

As shown in FIGS. 1 and 2, the SMIF system consists of a semiconductor wafer cassette 6 for housing a predetermined number of semiconductor wafers 7, a SMIF pod 8 for enclosing the semiconductor wafer cassette 6 airtightly and for transferring the semiconductor wafers 7 in the cassette 6 without exposing them to outside contamination, a wafer processing equipment 1 for processing the semiconductor wafers 7, and a pair of SMIF arms 4 and 4 provided on both sides of the processing equipment 1 for loading and unloading the cassette 6 to and from the processing equipment 1. The SMIF pod 8 consists of a box-like pod body with an open bottom and a bottom plate 10 for closing the bottom of the pod body 9. The bottom plate 10 is detachably attached to the pod body 9 by latches (not shown) provided on the pod body 9 and is arranged to support the cassette 6 at a proper position when the cassette 6 is enclosed in the pod 8. The bottom plate 10 of the SMIF pod 8 is fixed to the pod body 9 while the pod 8 is transported by a worker or a conveying apparatus. As shown in FIG. 1, the wafer processing equipment 1 consists of an equipment body 2 having a first port for the cassette 6, a transparent canopy 5 for covering an upper surface of the equipment body 2, and a clean air supply unit 3 mounted on the canopy 5. This clean air supply unit 3 having a high-performance filter and a blower supplies the wafer processing equipment 1 with clean air.

In order to transfer the cassette 6 into the processing equipment 1, the cassette 6 enclosed in the SMIF pod 8 is placed on the upper face of one of the SMIF arms 4. When the pod 8 is placed on it, the bottom plate 10 of the pod 8 is detached from the pod body 9, and then the bottom plate 10 and the cassette 6 supported on it are loaded into the SMIF arm 4. Thereafter, only the cassette 6 is transferred into the processing equipment 1, set in the first port, and then the wafers 7 in it are withdrawn to be processed.

After being processed in the processing equipment 1, the wafers 7 are housed in another cassette (not shown) and are loaded in the other SMIF arm 4. In this arm 4, the cassette is brought into another SMIF pod (not shown) which has been placed on the upper face of the other SMIF arm 4 without being exposed to outside contamination. After that, the pod 8 which has just received the cassette is transported, for example, by a worker to another processing equipment (not shown) of the next fabrication process and then placed on an SMIF arm of this equipment. Thereafter, the wafers 7 are processed in the equipment in the same manner as described above.

Accordingly, the wafers are not exposed to outside contamination but kept in clean air while being transported by workers and being transferred between the pod 8 and the equipment 1 as well as while being processed in the processing equipment. Therefore, a high product yield is maintained by using this SMIF system even when cleanliness (based on U.S. Federal Standard No. 209b) of a clean room in which the system is installed is about class 1,000 to 100,000. As a result, a non-laminar flow air current system which keeps its environment at cleanliness of class 1,000 to 100,000 is possibly employed in the clean room in place of a laminar flow air current system which keeps its environment at ultra high cleanliness of class 10 to 100. That is, associated facilities of the clean room become simple, and costs for its construction, facilities, and maintenances can be greatly reduced. Furthermore, it is not necessary, if the SMIF system is used, to limit the behaviour of workers who works in the clean room as strictly as it is limited in a clean room with ultra high cleanliness of class 10 to 100. The workers are allowed to work as if they are in an ordinary room on condition that they will wear simple clean room clothes. They are able to work more comfortably in this clean room using the SMIF system than in one not using it.

However, in the conventional semiconductor processing system described above, an installation space for the system including spaces for the two SMIF arms is required in a clean room, since the SMIF arms 4 must be attached on both sides of the wafer processing equipment 1. As a result, the conventional system not only makes it difficult to effectively utilize a floor space in the clean room, but also makes its total cost quite high.

SUMMARY OF THE INVENTION

It is an object of the present invention to provide a semiconductor processing system without the SMIF arms, which makes it easy to effectively utilize a clean room floor space.

It is another object of the present invention to provide a semiconductor processing system a total cost of which is reduced.

It is still another object of the present invention to provide a semiconductor processing system in which a horizontal orientation of the cassette is controlled when the cassette is transferred into or out of processing equipment so as to coincide with a predetermined orientation of the cassette in the processing equipment.

With these and other objects in view, the present invention provides a semiconductor processing system which includes: a first semiconductor wafer cassette for housing semiconductor wafers; a first transfer pod for enclosing the first cassette airtightly, the first pod having a box-like pod body with an open bottom and a bottom plate detachably attached to the pod body for closing the bottom of the pod body; a wafer processing equipment having a first port for loading the cassette and a canopy covering the first port, the processing equipment processing the wafer in the first cassette when the cassette is loaded in the first port; and a first mechanism for transferring the first cassette between the first port of the processing equipment and the first pod without exposing the cassette and the wafers therein to outside contamination. The first transferring mechanism includes: a second port, provided on the canopy of the processing equipment at the position directly above the first port, for placing the first pod on the second port, the second port including a port assembly for attaching and detaching the bottom plate of the first pod to and from the pod body when the first pod is placed on the second port; and a first lift mechanism, arranged mainly between the first and second ports, for conveying the bottom plate of the first pod between the first and second ports when the bottom plate of the pod is detached from the pod body.

In this arrangement, when the transfer pod having the cassette therein is placed on the second port, the bottom plate of the pod is detached from the pod body, and then the cassette on the bottom plate is transferred from the second port to the first port by the lift mechanism. Therefore, the cassette and wafers therein are transferred from the pod into the processing equipment without being exposed to outside contamination. Moreover, in a clean room having the system of the above construction, the floor space are utilized more effectively than it is utilized in a clean room having a conventional system, since the transferring mechanism is arranged not at the sides of but above the processing equipment.

It is preferred that the system has a second mechanism for transferring another cassette into and out of the processing equipment. The processing equipment may have a third port for loading the cassette, which is covered with the canopy, and a mechanism for processing the wafers in the first cassette in the first port and transferring the wafers into the cassette in the third port when the cassette with the wafers and the cassette being empty are loaded in the first and third ports respectively. The second transferring mechanism may have a fourth port, provided on the canopy of the processing equipment at the position directly above the third port, for placing the second pod thereon, and a second lift mechanism, arranged mainly between the third and fourth ports, for conveying the cassette between the third and fourth ports. In this case, the cassette housing the wafers which have been processed by the processing mechanism is transferred from the third port to the fourth port and enclosed in another pod.

Preferably, the second port has a cassette opening formed in the canopy of the processing equipment. Also, it is preferred that the first lift mechanism has a door plate for opening and closing the cassette opening of the second port. The door plate supports the bottom plate of the pod when the pod is placed on the second port. The lift mechanism may also have a drive unit for driving the door plate upwards and downwards.

The first transferring mechanism may have a mechanism for turning the bottom plate of the transfer pod about an axis perpendicular thereto so that the horizontal orientation of the bottom plate is controlled. In the presence of the rotating mechanism, it is not necessary to make the orientation of the cassette coincide with the predetermined orientation in the processing equipment before the pod is placed on the second port, since the orientation of the cassette can be changed even after the pod is placed on the second port. In other words, the system with this arrangement accelerates the total system automation such as the system of the above construction with automatic conveyers arranged between different processing equipments.

Furthermore, the processing equipment may have a clean air supply unit for maintaining the interior of the processing equipment at ultra high cleanliness.

BRIEF DESCRIPTION OF THE DRAWINGS

FIG. 6 is a view taken along the line VI—VI in FIG. 5;

FIG. 7 is a view taken along the line VII—VII in FIG. 5;

FIG. 8 is a sectional view of the second port in FIG. 3 showing a transfer pod placed thereon;

DETAILED DESCRIPTION OF THE PREFERRED EMBODIMENT

Figure 1:
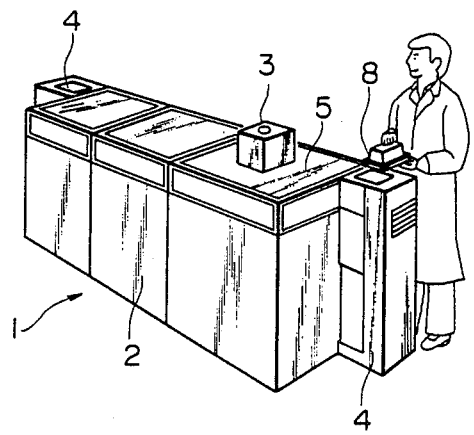
FIG. 1 is a schematic perspective view of a conventional semiconductor processing system.
Figure 2:
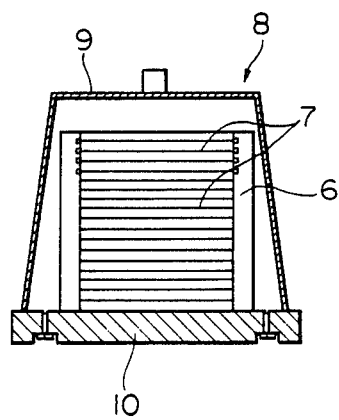
FIG. 2 is a sectional view of an SMIF pod in FIG. 1.

In FIGS. 3 to 10, the same parts as those in FIGS. 1 and 2 are designated by the same reference numerals, and a description thereof will be omitted.

Figure 3:
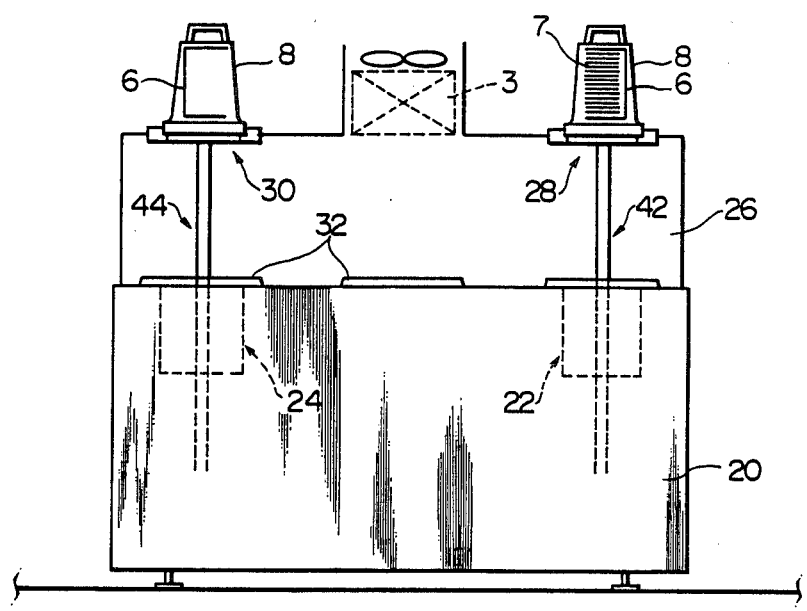
FIG. 3 is a schematic front view of a semiconductor processing system according to the present invention.
Figure 4:
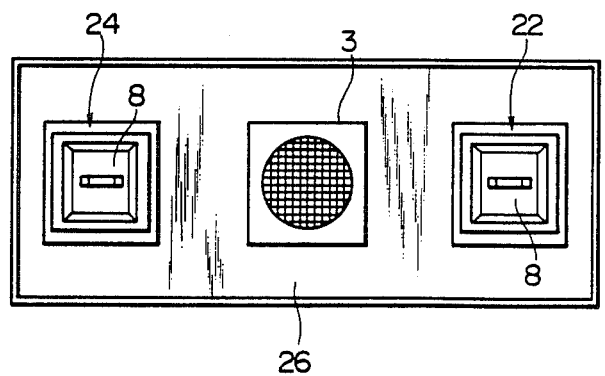
FIG. 4 is a schematic plan view of the semiconductor processing system in FIG. 3.

FIGS. 3 and 4 show a semiconductor processing system according to the present invention. In FIGS. 3 and 4, a wafer processing equipment 20 has upwardly open first and third ports 22 and 24 for loading and unloading the semiconductor wafer cassette 6 and a canopy which covers the first and third ports, 22 and 24. The canopy 26 is provided at its portions directly above the first and third ports 22 and 24 with second and fourth ports 28 and 30 on which the transfer pods (SMIF pods) 8 are placed. In FIGS. 3 and 4, a pod 8 is placed on each of the second and fourth ports 28 and 30. A pod 8 on the second port 28 contains a cassette 6 having the wafers 7 therein and the other pod 8 on the fourth port 30 encloses an empty cassette 6. The processing equipment 20 has an processing assembly in it which processes the wafers 7 in the cassette 6 in the first port 22 and transfers the wafers 7 into the cassette 6 in the third port 24 when the cassette 6 with the wafers 7 is set in the first port 22 and the empty cassette 6 is set in the third port 24. Therefore, the first port 22 is a loading port, and the third port 24 is a unloading port.

The clean air supply unit 3 which is mounted on the canopy 26 consists of a blower and a high-performance filter such as a ULPA (Ultra Low Penetration Air) filter and a HEPA (High Efficiency Particulate Air) filter. The clean air supply unit 3 supplies the processing equipment 20 with clean air to maintain the interior of the equipment at ultra high cleanliness. The unit 3 also sets the interior of the processing equipment 20 at a positive pressure higher than atmospheric pressure so that dust generated inside the equipment 20 is immediately exhausted outside the equipment 20 through ventilating slits 32 formed in the side wall of the canopy 26 and air exhaust openings open at the bottom of the processing equipment 20.

Figure 5:
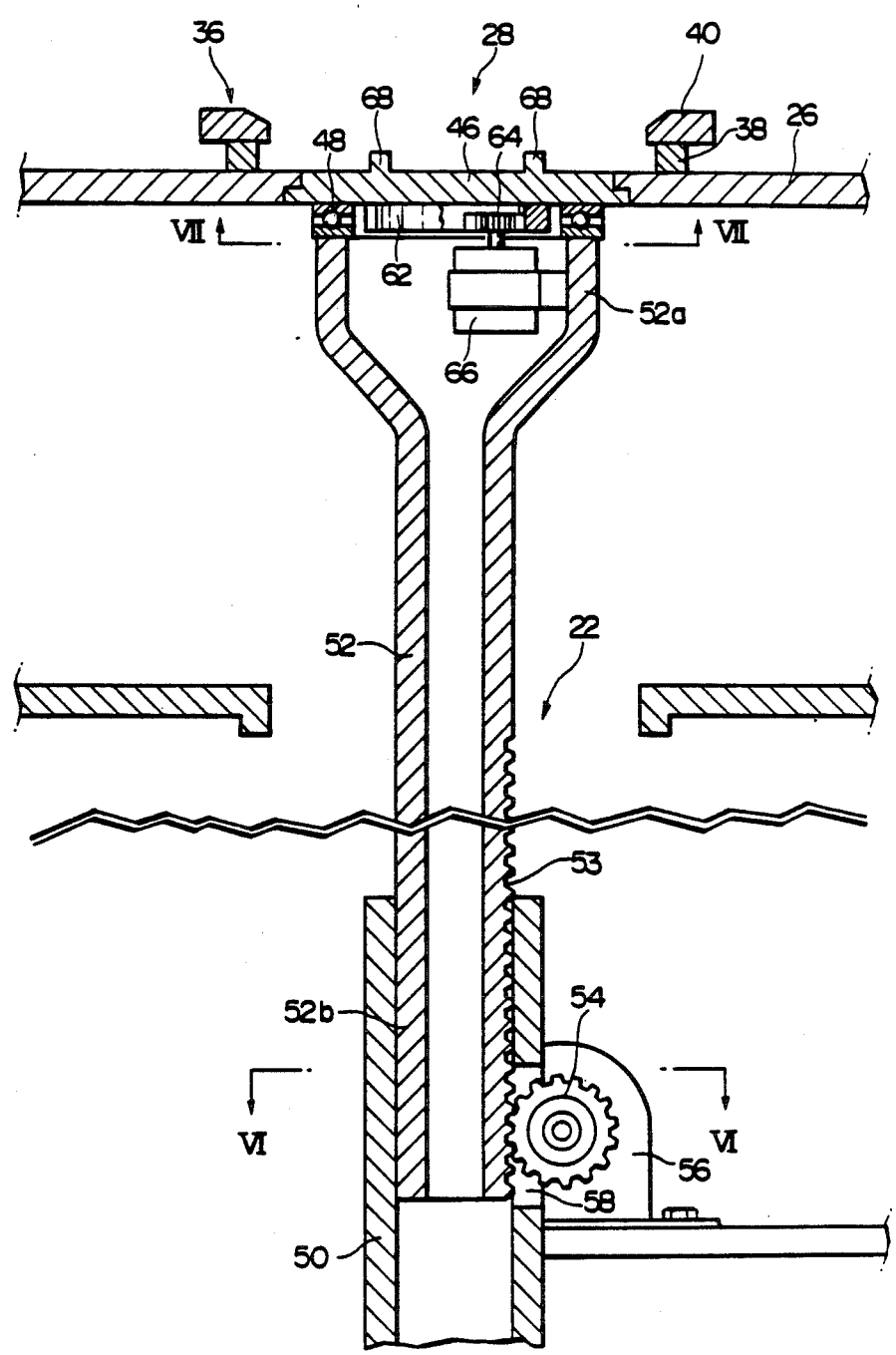
FIG. 5 is an enlarged sectional view of a second port, a first port, and a lift mechanism in FIG. 3.

As shown in FIG. 5, each of the second and fourth ports 28 and 30 has a cassette opening 34 formed in the canopy 26 and a port assembly 36 provided around the opening 34. The opening 34 has its inner diameter slightly larger than the diameter of the bottom plate 10 of the pod 8 and smaller than the outer diameter of the pod body 9. The port assembly 36 includes guides 38 disposed along the periphery of the opening 34, engaging sliders 40 slidably provided on the guides 38, a drive source such as a motor (not shown) for horizontally sliding the sliders 40 toward the center of the opening 34 and away therefrom, and a sensor such as an optical sensor (not shown) for detecting whether a pod 8 is in the corresponding port 28 or 30. The sensor generates a signal for turning on the drive source of the port assembly 36 when detecting the pod 8 in the port.

A first lift mechanism 42 is provided between the first and second ports 22 and 28. A second lift mechanism 44 is provided between the third and fourth ports 24 and 30. Each of the lift mechanisms 42 and 44 has a door plate 46 for opening and closing the cassette opening 34. This door plate 46 supports the bottom plate 10 of the pod 8 when the pod 8 is placed on the corresponding first or third port 28 or 30. The plate 46 is supported by a hollow drive shaft 52. The drive shaft 52 has an upper end portion 52a having a larger diameter than the other portion thereof, and is connected the upper end portion 52a via a magnetically sealed thrust bearing 48 to the lower surface of the door plate 46 so that the door plate 46 can rotate in a horizontal plane relative to the shaft 52. The lower end portion 52b of the shaft 52 is concentrically engaged with a vertrical guide tube 50, which is arranged under the corresponding port 22 or 24, so that the shaft 52 is vertically slidable relative to the guide tube 50. As shown in FIG. 6, the drive shaft 52 has splines 51 on the outer face thereof, which are received in keyways 55 formed in the inner face of the guide tube 50, thereby prevented from rotating. Engaging teeth 53 are formed on and along the drive shaft 52 so that a lower part of the drive shaft 52 serves as a rack. A pinion 54 is meshed with the engaging teeth 53 through a slot 58, which is formed through the wall of guide tube 50, and is connected to a stepping motor 56 secured to a casing of the equipment 20. When the stepping motor 56 is on to rotate the pinion 54, the drive shaft 52 is reciprocated vertically to drive the door plate 46 upward and downward.

As shown in FIG. 7, an internal gear 62 is fixed to the lower surface of the door plate 46, and a small gear 64 is meshed with the internal gear 62. The gear 64 is directly connected to an orientation control motor 66 which is secured to the inner face of the upper end portion 52a of the shaft 52. That is, by turning the control motor 66 on and off with a proper controlling unit, the door plate 46 is turned in a horizontal plane with respect to the drive shaft 52 so that the orientation of the bottom plate 10 of the pod 8 placed on the door plate 46, i.e., the horizontal orientation of the cassette 6 on the bottom plate 10 is suitably controlled. The guide tube 50 is in fluid communication with a vacuum pump (not shown) so that dust generated inside the upper end portion 52a of the shaft 52 is conveyed outside the equipment 20 through the guide tube 50.

A plurality of projections 68 are provided on the upper surface of the door plate 46. These projections 68 engage with the bottom plate 10 of the pod 8 so as to prevent the bottom plate 10 from slipping circumferentially during the turn of the door plate 46.

As shown in FIG. 8, the pod body 9 of the pod 8 has an outer flange 70 at its lower end. A plurality of latches 72 are pivotally connected to the outer flange 70 to be pivoted about pins 74. An upper end portion of each latch 72 projects above the outer flange 70, and its lower end portion is bent like a hook. Each latch 72 is biased at its lower end portion toward the center of the opening 34 by a spring (not shown) thereby kept in a position shown in FIG. 6 and engaging with the lower surface of the bottom plate 10 of the pod 8. The bottom plate 10 is detached from the pod body 9 by disengaging the latches 72 from the lower surface of the bottom plate 10. In addition, the bottom plate 10 of the pod 8 has recesses 76 on its lower surface for engaging with the projections 68 of the door plate 46.

As shown in FIG. 5, when the pod 8 is not placed on the corresponding second or fourth port 28 or 30, the door plate 46 of the corresponding lift mechanism 42 or 44 is in direct contact with that portion of the canopy 26 surrounding the opening 34, and thus the opening 34 is closed airtightly. When the pod 8 which encloses the cassette 6 with the wafers 7 is placed on the second port 28 as shown in FIG. 8, the sensor of the port assembly 36 detects the placement of the pod 8 and operates the drive source of the port assembly 36. Then, the slider 40 is translated toward the center of the opening 34 (in the direction indicated by the arrow A) and is engaged with the outer flange 70 of the pod body 9 to fix the pod body 9 to the canopy 26 of the equipment 20. In addition, since the slider 40 urges upper end portions of the latches 72 toward the center of the opening 34 during its translation, lower end portions of the latches 72 are pivoted in the direction indicated by the arrow B and hence disengaged from the lower surface of the bottom plate 10 of the pod 8. Accordingly, when the pod 8 is placed on the second port 28, the bottom plate 10 is detached from the pod body 9 and supported by the door plate 46 substantially at the same time.

Figure 9:
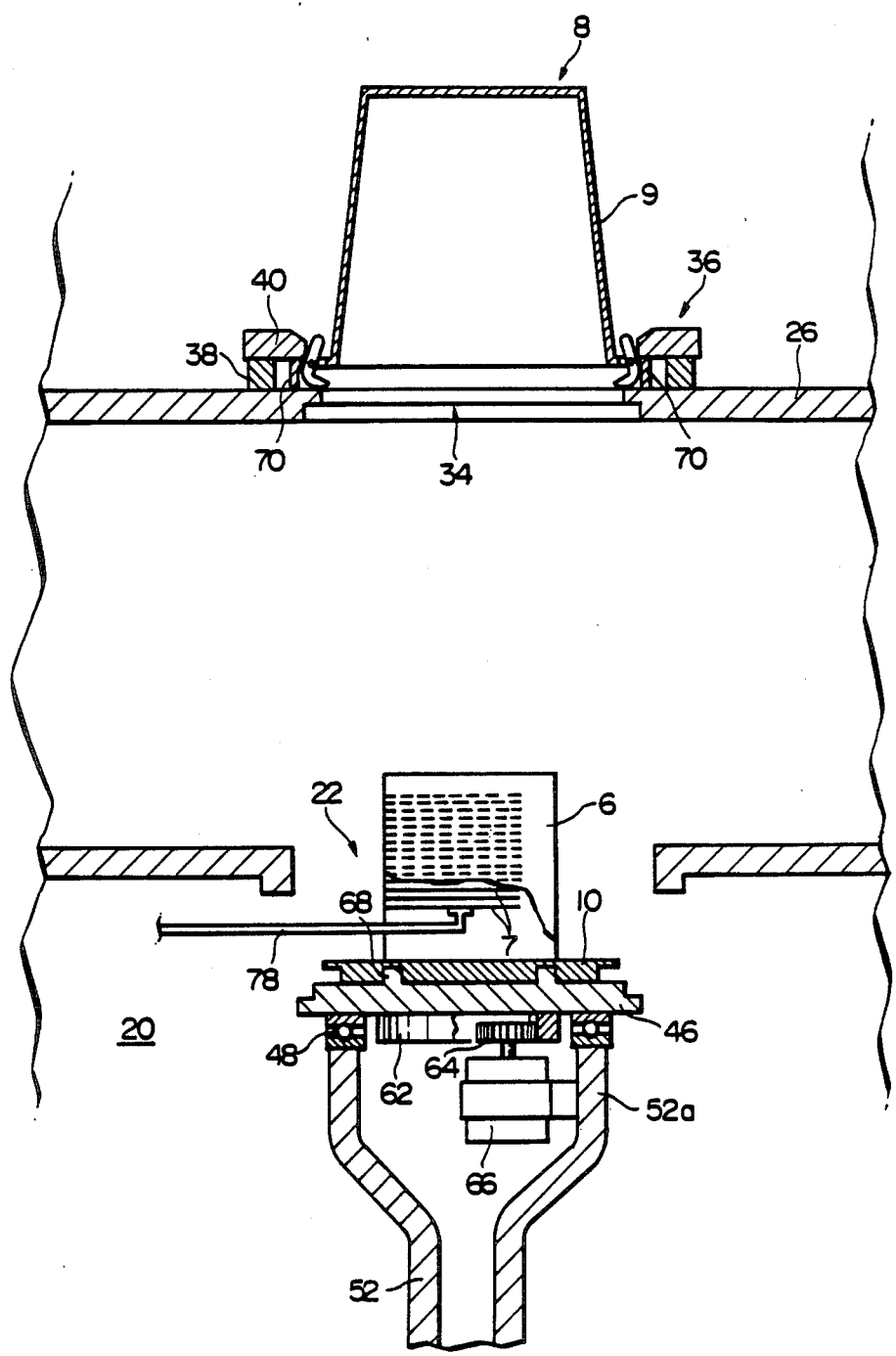
FIG. 9 is a sectional view of the second port and the first port in FIG. 5 showing a cassette loaded in the first port.

When the lift mechanism 42 is operated to drive the door plate 46 downward, the bottom plate 10 of the pod 8 is conveyed downward together with the door plate 46. Therefore, the cassette 6 on the bottom plate 10 is transferred into the loading port 22, as shown in FIG. 9. During this downward movement, the door plate 46 is turned properly to make the horizontal orientation of the cassette coincide with the predetermined orientation of the cassette in the processing equipment 20.

Figure 10:
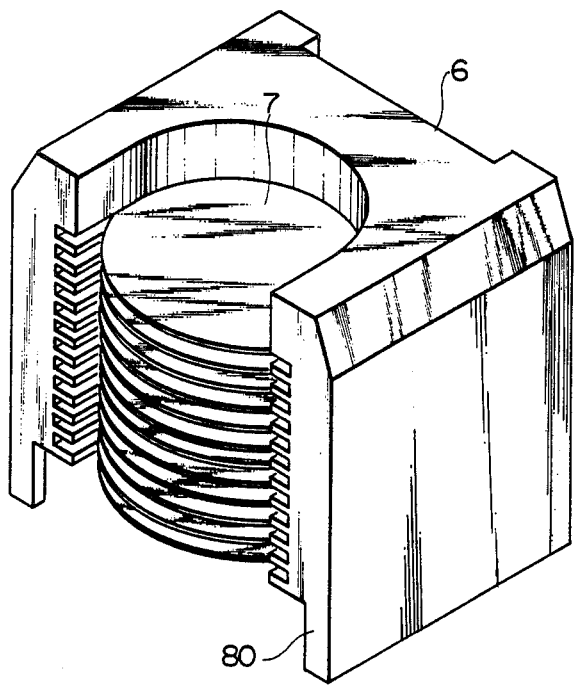
FIG. 10 is an enlarged perspective view of the cassette in FIG. 3 showing wafers housed therein.

As shown in FIG. 9, the wafers 7 in the cassette 6 which is loaded in the first port 22 are sequentially withdrawn one by one from the bottom of the cassette 6 and transferred to a processing assembly in the equipment 20. Whenever a wafer 7 is removed from the cassette 6 by the vacuum chuck 78, the door plate 46 is driven downward in units of predetermined pitches. Therefore, the wafers 7 to be removed next is always kept at the position where comes close enough to oppose the vacuum chuck 78 without vertical movement of the vacuum chuck 78. Unlike conventional systems, the cassette 6 is loaded in the first port 22 together with the bottom plate 10 of the pod 8. Therefore, as shown in FIG. 10, the cassette 6 is provided at its bottom with legs 80 so that a room into which the vacuum chuck 78 enters is assured in the cassette 6.

On the other hand, an empty cassette 6 is set in the unloading port 24 by using the fourth port 30 and the lift mechanism 44. Then, the wafers 7 which have been processed in the equipment 20 are transferred into the cassette 6 at the unloading port 24. In this process, the wafers 7 fill the cassette 6 sequentially from the uppermost step of the cassette 6 to the lowermost step. This order of filling process is opposite to that of wafer withdrawing process. Therefore, the door plate 46 is driven this time upward in units of predetermined pitches, whenever a wafer 7 is housed in the cassette 6.

Thereafter, the cassettes 6 at the loading and unloading ports 22 and 24 are conveyed upward to the second and fourth ports 28 and 30 respectively by the lift mechanisms and are enclosed in the respective pod bodies 9 fixed to the second and fourth ports 28 and 30. When the sliders 40 of the port assembly 36 are slid in the direction opposite to that of the arrow A, the pod body 9 of each pod 8 is detached from the canopy 26 and the lower end portions of the latches 72 are returned to the positions shown in FIG. 8 by the bias force of the springs. Therefore, the bottom plate 10 of each pod 8 is fixed to its pod body 9. After above operations, each pod 8 is ready to be transported. Accordingly, the pod 8 on the second port 28 is removed from the equipment 20 and the pod 8 on the fourth port 30 is transported to another processing equipment (not shown) by a worker, a transferring equipment or the like for the next process.

As has been described, since the cassette is transferred between the pod and the processing equipment by the second and fourth ports 28 and 30 which are directly above the first and third ports 22 and 24 respectively and the lift mechanisms 42 and 44, it is not necessary to provide SMIF arms at the both side of the processing equipment. Accordingly, the installation area for the SMIF arms is effectively utilized as a free space in a clean room by slightly modifying conventional semiconductor processing systems, and the cost of the entire processing system is reduced.

The guide tube 50 may be connected to a vertical guide rail so as to move upwards and downwards. In this case, teeth may be formed on the outer face of the tube 50 in order to drive the tube with a stepping motor, and the pinion 54 may be meshed with the teeth 53 so as to be removable from it.

Although one embodiment of the present invention has been described, the present invention is not limited to this embodiment. For example, clean air produced in a main air conditioner may be introduced via a duct into the processing equipment 20 instead of being supplied by the clean air supply unit 3. IN addition, the lift mechanism may be constituted of a ball screw assembly or an extendable component formed like a pantagraph in place of the rack drive shaft 52, the stepping motor 56, and the like.

What is claimed is:

1. In a semiconductor processing system which includes: a first semiconductor wafer cassette for housing semiconductor wafers; a first transfer pod for enclosing the first cassette airtightly, said first pod having a box-like pod body with an open bottom and a bottom plate detachably attached to the pod body and carrying the first cassette thereon; a wafer processing equipment including, a loading port for receiving the cassette so that the first cassette is retained in the loading port during the processing of the wafer cassette, and a canopy covering the loading port, said processing equipment including means for withdrawing the wafers from the first cassette to process the wafers when the cassette is set in the loading port; and first means for transferring the first cassette between the loading port of the processing equipment and the first pod without exposing the cassette and the wafers therein to outside contamination, the improvement wherein said first transferring means comprises:

an inlet port, including a first cassette opening on the canopy of the processing equipment at the position directly above the loading port, for placing the first pod thereon, said inlet port including, a port assembly for attaching and detaching the bottom plate of the first pod to and from the pod body when the first pod is placed on the inlet port, and a second cassette opening, formed in the canopy of the processing equipment, for allowing the bottom plate of the first pod to pass therethrough said first and second cassette openings being spaced from and in vertical alignment with each other; and first lift means, arranged mainly between the openings in the loading and inlet ports, for conveying the bottom plate of the first pod between the loading and inlet ports when the bottom plate of the first pod is detached from the pod body.

2. A semiconductor processing system as recited in claim 1, further comprising: a second cassette for containing semiconductor wafer; a second transfer pod for enclosing the second cassette airtightly, said second pod having a box-like pod body with an open bottom and a bottom plate detachably attached to the pod body of the second pod for closing the bottom of the pod body; and second means for transferring the second cassette into and out of the processing equipment, said processing equipment further comprising: an unloading port for receiving the second cassette so that the second cassette is retained in the unloading port, said unloading port being covered with said canopy; and means for processing the wafers withdrawn from the first cassette and for transferring the processed wafers into the second cassette when the first cassette with the wafers and the second cassette being empty are set in the loading and unloading ports respectively, said second transferring means comprising: an outlet port, provided on the canopy of the processing equipment at the position directly above the unloading port, for placing the second pod thereon; and second lift means, arranged mainly between the unloading and outlet ports, for conveying the second cassette between the unloading and outlet ports.

3. A semiconductor processing system as recited in claim 2, wherein said outlet port further includes a cassette opening formed in the canopy of the processing equipment, wherein said second lift means comprises: a door plate for opening and closing the cassette opening of the outlet port, said door plate having a lower surface and supporting the bottom plate of the second pod when the second pod is placed on the outlet port; a vertical guide member arranged under the outlet port; a drive shaft having upper end portion and being of a hollow construction, the drive shaft being slidably connected to the vertical guide member for vertical movement, the upper end portion of the drive shaft being connected to the lower surface of the door plate; and a first drive motor for moving the drive shaft vertically, and wherein said second transferring means further comprises means for turning the bottom plate of the second transfer pod about an axis perpendicular thereto so that the horizontal orientation of the cassette on the bottom plate of the second pod is adjusted, said turning means comprising: a bearing member interposed between the upper end portion of the drive shaft and the lower surface of the door plate, thereby enabling the door plate to turn about the axis of the drive shaft; a second drive motor, disposed in the drive shaft for turning the door plate; and means for drivingly connecting the second drive motor to the door plate.

4. A semiconductor processing system as recited in claim 1, wherein said first lift means comprises a door plate for opening and closing the cassette opening of the inlet port, said door plate supporting the bottom plate of the pod when the pod is placed on the inlet port, and a drive unit for driving the door plate upwards and downwards.

5. A semiconductor processing system as recited in claim 4, wherein said door plate has a lower surface, and wherein said drive unit comprises: a vertical guide member arranged under the inlet port; a drive shaft having an upper end portion and slidably connected to the vertical guide member for vertical movement, the upper end portion of the drive shaft being connected to the lower surface of the door plate; and a first drive motor for moving the drive shaft.

6. A semiconductor processing system as recited in claim 5, wherein said first transferring means further comprises means for turning the bottom plate of the first transfer pod about an axis perpendicular thereto so that the horizontal orientation of the cassette on the bottom plate is adjusted.

7. A semiconductor processing system as recited in claim 6, wherein said drive shaft is of a hollow construction, and wherein said turning means comprises: a bearing member interposed between the upper end portion of the drive shaft and the lower surface of the door plate, thereby enabling the door plate to turn about the axis of the drive shaft; a second drive motor disposed in the drive shaft for turning the door plate; and means for drivingly connecting the second drive motor to the door plate.

8. A semiconductor processing system as recited in claim 7, wherein said processing equipment further comprises a clean air supply unit for maintaining an interior of the processing equipment at ultra high cleanliness.

* * * * *